United States Patent
Han et al.

(10) Patent No.: US 8,840,798 B2
(45) Date of Patent: Sep. 23, 2014

(54) CHEMICAL MECHANICAL POLISHING SLURRY COMPOSITION AND METHOD FOR PRODUCING SEMICONDUCTOR DEVICE USING THE SAME

(75) Inventors: Deok-Su Han, Daejeon (KR); Hwan-Chul Kim, Gyeonggi-do (KR); Seok-Joo Kim, Chungcheongnam-do (KR); Hyu-Bum Park, Chuncheongnam (KR)

(73) Assignee: Soulbrain Co., Ltd., Gyeonggi-do (KR)

( * ) Notice: Subject to any disclaimer, the term of this patent is extended or adjusted under 35 U.S.C. 154(b) by 55 days.

(21) Appl. No.: 13/327,991

(22) Filed: Dec. 16, 2011

(65) Prior Publication Data
US 2012/0156874 A1 Jun. 21, 2012

(30) Foreign Application Priority Data

Dec. 17, 2010 (KR) .................. 10-2010-0130258

(51) Int. Cl.
| | | |
|---|---|---|
| *H01L 21/302* | (2006.01) | |
| *C09G 1/02* | (2006.01) | |
| *C09K 13/00* | (2006.01) | |
| *H01L 21/3105* | (2006.01) | |

(52) U.S. Cl.
CPC ........... *H01L 21/31053* (2013.01); *C09G 1/02* (2013.01)
USPC ............ 216/89; 438/693; 252/79.1; 252/79.2

(58) Field of Classification Search
None
See application file for complete search history.

(56) References Cited

U.S. PATENT DOCUMENTS

| | | | |
|---|---|---|---|
| 2009/0081927 A1* | 3/2009 | Grumbine et al. | 451/36 |
| 2010/0081279 A1* | 4/2010 | Palmer et al. | 438/667 |
| 2011/0300710 A1* | 12/2011 | Henry et al. | 438/693 |

FOREIGN PATENT DOCUMENTS

| | | |
|---|---|---|
| CN | 101802116 A | 8/2010 |
| JP | 2009-256184 | 11/2009 |
| KR | 2010-0065386 | 6/2010 |

OTHER PUBLICATIONS

Office Action from the Korean Patent Office dated Mar. 20, 2012, issued in corresponding Korean Patent Application 10-2010-0130258.
Taiwanese Search Report dated Sep. 30, 2013, issued by the Taiwanese Patent Office in connection with corresponding Taiwanese Patent Application No. 100146942.
Office Action from the Chinese Patent Office dated Nov. 19, 2013, issued in corresponding Chinese Patent Application 201110433308.1.

* cited by examiner

*Primary Examiner* — Anita Alanko
(74) *Attorney, Agent, or Firm* — IP Legal Services, LLC

(57) ABSTRACT

A slurry composition for chemical mechanical polishing, including 0.1% to 20% by weight of an aminosilane-surface treated polishing agent; 0.001% to 5% by weight of an additive selected from amino acids, amino acid derivatives, salts thereof, and combinations thereof; 0.0001% to 0.5% by weight of a corrosion inhibitor; and 0.01% to 5% by weight of an oxidizing agent, with the balance being a solvent, is provided. The slurry composition for chemical mechanical polishing has a conspicuously high polishing rate for silicon oxide films, is capable of selectively preventing the removal of silicon nitride films, does not cause an imbalance in polishing, gives an excellent degree of planarization, has excellent stability over time and dispersion stability, causes less generation of particles and scratches, and produces very satisfactory polished surfaces of barrier metal films and oxide films.

11 Claims, 2 Drawing Sheets

CHEMICAL MECHANICAL POLISHING SLURRY COMPOSITION AND METHOD FOR PRODUCING SEMICONDUCTOR DEVICE USING THE SAME

BACKGROUND OF THE INVENTION

1. Field of the Invention

The present invention relates to a slurry composition for chemical mechanical polishing (CMP), and more particularly, the present invention relates to a slurry composition for chemical mechanical polishing, which exhibits high polishing rates for barrier metal films and silicon oxide films, is capable of controlling the polishing rate for silicon nitride films, and thereby has a high polishing selection ratio.

2. Description of Related Art

In the chemical mechanical polishing process, which is one of the production processes for semiconductor devices, a polishing process is carried out by mounting on a platen a wafer that is to be subjected to a planarization process, bringing the surface of this wafer into contact with a pad of a polishing machine, and then rotating a rotating plate and the pad of the polishing machine while a slurry is supplied. That is, a slurry flows between the wafer surface and the pad, and polishing of the wafer surface is achieved as a result of the mechanical friction caused by the polishing particles in the slurry and the protrusions at the surface of the pad, while chemical removal is achieved as a result of a chemical reaction between the chemical components in the slurry and the wafer surface.

Generally, the slurry used in a secondary CMP process for copper includes a colloidal silica polishing material, and has a feature of being capable of removing barrier metal films and oxide films in a basic zone. However, in a basic zone, the removal rate of tantalum used as a barrier metal is not so high that a long time is required. Furthermore, since large amounts of polishing materials are used in order to increase the polishing rate for oxide film, there are disadvantages such as particle contamination and high occurrence of scratches.

On the other hand, in an acidic zone, the particle contamination after polishing tends to occur at a lower level than in a basic zone; however, there is a disadvantage that an isoelectric point of the colloidal silica used as the polishing material is reached, and the dispersion stability of the slurry deteriorates.

Furthermore, recently, the degree of semiconductor integration is approaching the physical limit, and a three-dimensional integrated circuit (3D IC) process is under the spotlight. During the 3D IC process, a through-silicon via (TSV) process is used in the wiring production process. However, since the thicknesses of the barrier film, insulating film and polishing preventing film for forming through silicon vias tend to increase, there is a need to polish a barrier film effectively in a short time.

SUMMARY OF THE INVENTION

An object of the present invention is to provide a slurry composition for chemical mechanical polishing, which has a conspicuously high polishing rate for silicon oxide film, is capable of selectively preventing the removal of silicon nitride film, does not cause an imbalance in polishing, can give an excellent degree of planarization, has excellent stability over time and dispersion stability, causes less generation of particles and scratches due to the optimal composition of additives, and produces very satisfactory polished surfaces of barrier metals and oxides.

A slurry composition for chemical mechanical polishing according to an aspect of the present invention includes 0.1% to 20% by weight of an aminosilane-surface treated polishing agent; 0.001% to 5% by weight of any one additive selected from the group consisting of amino acids, derivatives of amino acids, salts thereof, and combinations thereof; 0.0001% to 0.5% by weight of a corrosion inhibitor; and 0.01% to 5% by weight of an oxidizing agent, with the balance being a solvent.

The slurry composition for chemical mechanical polishing may have a polishing selection ratio for silicone oxide film to silicon nitride film, of 5 or greater.

The slurry composition for chemical mechanical polishing may have a pH value of 2 to 5.

The aminosilane may be selected from the group consisting of aminopropyltrialkoxysilane, γ-aminopropyltriethoxysilane, bis(2-hydroxyethyl)-3-aminopropyltrialkoxysilane, diethylaminomethyltrialkoxysilane, (N,N-diethyl-3-aminopropyl)trialkoxysilane, 3-(N-styrylmethyl-2-aminoethylamino)-propyltrialkoxysilane, (2-N-benzylaminoethyl)-3-aminopropyltrialkoxysilane, trialkoxysilylpropyl-N,N,N-trimethylammonium chloride, N-(trialkoxysilylethyl)benzyl-N,N,N-trimethylammonium chloride, bis(methyldialkoxysilylpropyl)-N-methylamine, bis(trialkoxysilylpropyl)urea, bis(3-(trialkoxysilyl)propyl)-ethylenediamine, bis(trialkoxysilylpropyl)amine, bis(trimethoxysilylpropyl)amine, and combinations thereof.

The amino acid may be any one selected from the group consisting of valine, leucine, isoleucine, serine, threonine, cysteine, glycine, alanine, methionine, glutamic acid, aspartic acid, glutamine, asparagine, lysine, arginine, phenylalanine, tyrosine, tryptophan, histidine, proline, derivatives thereof, salts thereof, and combinations thereof.

The corrosion inhibitor may be any one selected from the group consisting of 1,2,4-triazole, benzotriazole, 5-methylbenzotriazole, 5-aminotetrazole, tetrazole-5-thiol, imidazole, and combinations thereof.

The oxidizing agent may be any one selected from the group consisting of hydrogen peroxide, persulfates such as monopersulfates and dipersulfates, and combinations thereof.

The aminosilane-surface treated polishing agent may contain a colloidal silica having an average particle size of 5 to 120 nm, and an aminosilane in an amount of 0.001% to 1% by weight relative to the total amount of the polishing agent.

The slurry composition for chemical mechanical polishing may further include any one pH adjusting agent selected from the group consisting of potassium hydroxide, ammonium hydroxide, tetramethylammonium hydroxide, tetraethylammonium hydroxide, tetrabutylammonium hydroxide, nitric acid, hydrochloric acid, sulfuric acid, perchloric acid, phosphoric acid, and combinations thereof.

The slurry composition for chemical mechanical polishing may further include a polishing profile improving agent containing a glycol group, in an amount of 0.001% to 5% by weight relative to the total amount of the slurry composition for chemical mechanical polishing.

The profile improving agent may be any one selected from the group consisting of ethylene glycol, propylene glycol, polyethylene glycol, polypropylene glycol, and combinations thereof.

A method for producing a semiconductor device according to another aspect of the present invention includes a step of simultaneously polishing a barrier metal film, a silicone oxide film and a silicon nitride film, using the slurry composition for chemical mechanical polishing described above.

Through silicon vias can be formed by the polishing step described above.

DETAILED DESCRIPTION OF THE INVENTION

Figure 1:
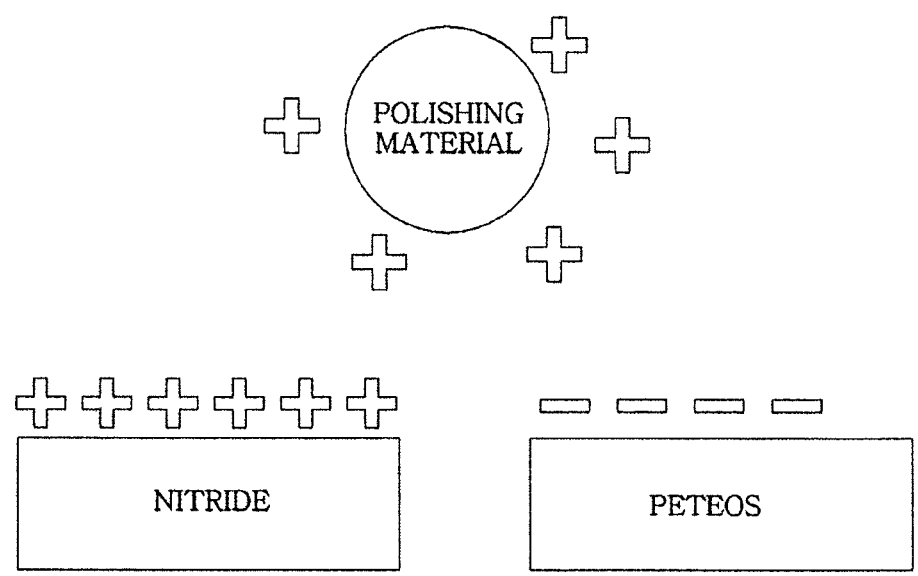
FIG. 1 is a diagram showing the polishing mechanism of the slurry composition for chemical mechanical polishing according to the present invention.

Hereinafter, the present invention will be described in more detail.

The slurry composition for chemical mechanical polishing described above includes 0.1% to 20% by weight of an aminosilane-surface treated polishing agent; 0.001% to 5% by weight of any one additive selected from the group consisting of amino acids, derivatives of amino acids, salts thereof, and combinations thereof; 0.0001% to 0.5% by weight of a corrosion inhibitor; and 0.01% to 5% by weight of an oxidizing agent, with the balance being a solvent.

The slurry composition for chemical mechanical polishing may have a polishing selection ratio for silicon oxide film to silicon nitride film of 5 or greater, and preferably 7 to 50. The polishing selection ratio for silicon oxide film to silicon nitride film means a value obtained by dividing the polishing rate for a silicon oxide film, by the polishing rate for a silicon nitride film. The slurry composition for chemical mechanical polishing has a very high polishing selection ratio for silicon oxide film to silicon nitride film, so that the slurry composition can selectively polish silicon nitride films and silicon oxide films very efficiently, and has an excellent polishing rate for silicon oxide films.

The slurry composition for chemical mechanical polishing may have a pH value of 2 to 5, and preferably 3 to 3.9. When the pH of the slurry composition for chemical mechanical polishing is in the range described above, the polishing rate for silicon oxide films and the polishing selection ratio for silicon oxide film to silicon nitride film can be enhanced. Furthermore, if the pH of the slurry composition for chemical mechanical polishing is less than 2, the polishing rate decreases, and a desired polishing selection ratio cannot be obtained. If the pH is greater than 5, there may be a problem in stability during a long-term storage, due to the aggregation of the slurry.

For the purpose of pH adjustment, the slurry composition for chemical mechanical polishing may further include any one pH adjusting agent selected from the group consisting of potassium hydroxide, ammonium hydroxide, tetramethylammonium hydroxide, tetraethylammonium hydroxide, tetrabutylammonium hydroxide, nitric acid, hydrochloric acid, sulfuric acid, perchloric acid, phosphoric acid, and combinations thereof.

The polishing agent may be an acidic colloidal silica polishing agent, and for the acidic colloidal silica, an acidic colloidal silica produced by allowing an alkali metal silicate solution with an inorganic acid and passing the reaction product through a strongly acidic cation exchange resin, or an acidic colloidal silica produced by hydrolyzing a high purity alkoxysilane can be used.

The colloidal silica may have an average particle size of 5 to 120 nm, and preferably 20 to 100 nm. If the average particle size of the colloidal silica is less than 5 nm, a polishing rate of a desired level cannot be realized, and if the average particle size exceeds 120 nm, it may be difficult to maintain the stability of the polishing agent.

The polishing agent may be incorporated in an amount of 0.1% to 20% by weight, and preferably 3% to 10% by weight, relative to the total amount of the slurry composition for chemical mechanical polishing. If the content of the polishing agent is less than 0.1% by weight, a high polishing rate is not likely to be obtained, and if the content is greater than 20% by weight, the economic efficiency is low.

The polishing agent is charged to have a positive value for the surface potential through the aminosilane treatment. The polishing agent can be surface treated with an aminosilane in an amount of 0.001% to 1% by weight, and preferably 0.05% to 1% by weight, relative to the total amount of the polishing agent. If the content of the aminosilane is less than 0.001% by weight, it is not easy to change the value of the surface potential, and if the content is greater than 1% by weight, the surface potential increases so high that the polishing rate may be rather decreased.

A superior effect of performance enhancement can be obtained at the time of surface treatment by using an aminosilane having a linear structure, and such an aminosilane may be any one selected from the group consisting of aminopropyltrialkoxysilane, γ-aminopropyltriethoxysilane, bis(2-hydroxyethyl)-3-aminopropyltrialkoxysilane, diethylaminomethyltrialkoxysilane, (N,N-diethyl-3-aminopropyl) trialkoxysilane, 3-(N-styrylmethyl-2-aminoethylamino)-propyltrialkoxysilane, (2-N-benzylaminoethyl)-3-aminopropyltrialkoxysilane, trialkoxysilylpropyl-N,N,N-trimethylammonium chloride, N-(trialkoxysilylethyl)benzyl-N,N,N-trimethylammonium chloride, bis(methyldialkoxysilylpropyl)-N-methylamine, bis(trialkoxysilylpropyl)urea, bis(3-(trialkoxysilyl)propyl)-ethylenediamine, bis(trialkoxysilylpropyl)amine, bis(trimethoxysilylpropyl)amine, and combinations thereof.

Particularly, in the case of surface treating the polishing agent with γ-aminopropyltriethoxysilane, when the aminosilane is slowly introduced into the polishing material and the mixture is vigorously stirred, uniform coating can be achieved. Also, the silane is dispersed in the aqueous solution, and as the alkoxy group is detached, a side product in the form of alcohol is produced, while the silanol group forms a strong chemical bonding with the hydroxyl group of the polishing agent through a Si—O—Si bond. Therefore, the bonding is not broken by an additive compound that is added at the time of preparing the polishing slurry.

The additive is any one selected from the group consisting of amino acids, derivatives of amino acids, salts thereof, and combinations thereof. FIG. 1 is a diagram showing the polishing mechanism of the slurry composition for chemical mechanical polishing of the present invention. According to FIG. 1, the anionic functional groups of the additive are ionized under the acidic pH conditions of the present invention. When the anionic functional groups are exposed to a silicon oxide film and a silicon nitride film, the anionic functional groups are bonded to the silicon nitride film, and the cationic functional groups face toward the outside. Thus, the additive bonded to the silicon nitride film exerts an inhibitory action of preventing the polishing material from being in direct contact with the silicon nitride film. Accordingly, due to the interaction between the surface charge of the polishing agent resulting from the aminosilane treatment and the additive, the polishing rate for the silicon oxide film can be enhanced to a large extent, and the polishing rate for the silicon nitride film is decreased. Thus, the polishing selection ratio for silicon oxide film to silicon nitride film can be conspicuously enhanced.

The amino acid may be any one selected from the group consisting of valine, leucine, isoleucine, serine, threonine, cysteine, glycine, alanine, methionine, glutamic acid, aspartic acid, glutamine, asparagine, lysine, arginine, phenylalanine, tyrosine, tryptophan, histidine, proline, derivatives thereof, and mixtures thereof. Among them, alanine, phenylalanine, glycine, and derivatives thereof can be used with preference.

The additive may be incorporated in an amount of 0.001% to 5% by weight, and preferably 0.005% to 0.5% by weight, relative to the total amount of the slurry composition for chemical mechanical polishing. If the content of the additive is less than 0.001% by weight, the additive may not play the role sufficiently, and if the content is greater than 5% by weight, the polishing rate for silicon oxide films tends to decrease.

The weight ratio of the aminosilane and the additive in the polishing agent may be 1:2 to 1:50, and preferably 1:4 to 1:15. When the weight ratio of the aminosilane and the additive in the polishing agent is in the range described above, the polishing rate for silicon oxide films and the polishing selection ratio for silicon oxide film to silicon nitride film can be enhanced. Furthermore, if the weight ratio of the aminosilane and the additive in the polishing agent exceeds the range described above, even though the content of the additive is increased, the extent of decrease of the polishing rate for silicon oxide films will be negligible, and the polishing rate for silicon nitride films may not change significantly.

The slurry composition for chemical mechanical polishing can further include a profile improving agent. The profile improving agent may be a low molecular weight compound or a polymer compound, both containing a glycol group. Preferred examples that can be used include ethylene glycol, propylene glycol, polyethylene glycol, and polypropylene glycol.

The profile improving agent may be incorporated in an amount of 0.01% to 5% by weight relative to the total amount of the slurry composition for chemical mechanical polishing. If the content of the profile improving agent is less than 0.01% by mass, it is difficult to obtain the profile improving effect, and if the content is greater than 5% by weight, a decrease in the polishing rate may be brought.

The slurry composition for chemical mechanical polishing may further include a corrosion inhibitor. As the corrosion inhibitor, any one selected from the group consisting of 1,2,4-triazole, benzotriazole, 5-methylbenzotriazole, 5-aminotetrazole, 1-alkyl-5-aminotetrazole, 5-hydroxytetrazole, 1-alkyl-5-hydroxytetrazole, tetrazole-5-thiol, imidazole, and combinations thereof can be used.

The corrosion inhibitor can be incorporated in an amount of 0.0001% to 0.5% by weight relative to the total amount of the slurry composition for chemical mechanical polishing. If the content of the corrosion inhibitor is less than 0.0001% by weight, it is difficult to expect a corrosion inhibiting effect, and if the content is greater than 0.5% by weight, the polishing rate for metal films may be decreased, and a problem of solubility occurs, so that the corrosion inhibitor may be precipitated out.

The slurry composition for chemical mechanical polishing may further include an oxidizing agent. The oxidizing agent may be any one selected from the group consisting of a compound having one or more peroxy groups, a compound containing an element that is in the highest oxidation state, and combinations thereof.

Examples of the compound having one or more peroxy groups that can be used include hydrogen peroxide addition products such as hydrogen peroxide, urea hydrogen peroxide and percarbonate; organic peroxides such as benzoyl peroxide, peracetic acid and di-t-butyl peroxide; persulfates (monopersulfates or dipersulfates); sodium peroxide; and mixtures thereof.

Examples of the compound containing an element that is in the highest oxidation state include periodates, perborates, and permanganates.

Furthermore, as the oxidizing agent, non-per compounds can also be used, and examples of the non-per compounds that can be used include bromates, chromates, iodates, iodic acid, cerium(IV) compounds such as cerium ammonium nitrate; and compounds such as ferric nitrate.

As the oxidizing agent, hydrogen peroxide can be used with preference, and the oxidizing agent may be incorporated in an amount of 0.01% to 5% by weight, and preferably 0.05% to 3% by weight, relative to the total amount of the slurry composition for chemical mechanical polishing. If the content of the oxidizing agent is less than 0.01% by weight, severe scratches may be generated on the surface of tantalum as a barrier metal film, and if the content is greater than 3% by weight, the polishing rate for silicon oxide films may be decreased.

In regard to the solvent included in the slurry composition for chemical mechanical polishing, any solvent that is used in slurry compositions for chemical mechanical polishing can be used, and for example, deionized water may be used, but the present invention is not limited thereto. Furthermore, the content of the solvent is the remainder obtainable by subtracting the contents of the aminosilane-surface treated polishing agent, additives such as amino acid, and additional additives, from the total amount of the slurry composition for chemical mechanical polishing.

The method for producing a semiconductor device according to another embodiment of the present invention includes a step of simultaneously polishing a barrier metal film, a silicon oxide film and a silicon nitride film using the slurry composition for chemical mechanical polishing. Through silicon vias can be formed by the polishing step. In regard to the method for simultaneously polishing a barrier metal film, a silicon oxide film and a silicon nitride film using the slurry composition for chemical mechanical polishing, any of conventional polishing methods and conditions that are generally used can be used, and there are no particular limitations on the present invention. Therefore, specific descriptions on the polishing method and conditions will not be given in the present specification.

The slurry composition for chemical mechanical polishing can polish silicon oxide films and silicon nitride films such that a polishing selection ratio for silicon oxide film to silicon nitride film of 5 or greater, and preferably 7 to 50 is obtained.

The slurry composition according to an embodiment of the present invention has a conspicuously high polishing rate for silicon oxide films, and thus, the process of removing insulating films can be finished in a short time. Since the removal of silicon nitride films used as polishing preventing films can be selectively prevented, excellent characteristics can be obtained during the production of devices. Furthermore, the slurry composition of the present invention can maintain the polishing rates for barrier metal films and insulating films uniform, does not cause an imbalance in the polishing due to the difference of the polishing rates, and has appropriate polishing rates for tantalum films and silicon oxide films, so that an excellent degree of planarization can be obtained. The slurry composition also has an advantage that dishing and erosion caused by primary CMP processes can be effectively eliminated in a short time. Furthermore, the slurry composition of the present invention also has an advantage that the slurry composition has excellent stability over time and dispersion stability, causes less generation of particles and scratches, and produces very satisfactory polished surfaces of barrier metal films and oxide films.

Furthermore, the slurry composition for chemical mechanical polishing can polish barrier metal films, oxide films and polishing preventing films at high rates and shorten the polishing time as compared with existing slurries, and thus, the slurry composition is highly advantageous in an enhancement of productivity.

Hereinafter, the present invention will be described in detail by way of Examples so that those having ordinary skill in the art can easily carry out the present invention. However, the present invention can be realized in various different forms, and is not intended to be limited to the Examples described herein.

EXPERIMENT EXAMPLES

A tantalum specimen wafer on which a thin film having a thickness of 1000 Å is deposited was used for polishing. For a silicon oxide film, a specimen wafer on which a PETEOS thin film having a thickness of 10000 Å was used, and for a silicon nitride film, a specimen wafer on which a thin film having a thickness of 3000 Å was used.

As for the polishing apparatus, Poli 400 (manufactured by G & P Technology, Inc.) was used, and a polishing test was carried out using a polishing pad, IC1000 (Dow Corning Corp.). The polishing conditions were such that the table/head speed was 93/87 rpm, the polishing pressure was 140 g/cm$^2$, the slurry supply flow rate was 200 ml/min, and the polishing time was 30 seconds to 60 seconds.

The tantalum thin film thickness was determined by measuring the surface resistance using a four-point probe surface resistance analyzer (AIT Semiconductor, Inc.), and then calculating the thickness therefrom. The thin film thicknesses of PETEOS and silicon nitride films were measured with Spectra Thick 4000 (K-MAC Corp.).

Experiment Example 1

Polishing slurry compositions of Examples and Comparative Examples were prepared in the compositions as indicated in the following Table 1. Furthermore, an evaluation of polishing was carried out for the prepared polishing slurry compositions, and the results are also presented in Table 1.

The colloidal silicas used in the following Table 1 were colloidal silicas having an average particle size of 35 nm, 55 nm and 75 nm, respectively, and each of the colloidal silicas was used after uniformly surface treating the colloidal silica with γ-aminopropyltriethoxysilane in an amount of 0.25% by weight relative to the total amount of the polishing agent.

Furthermore, a polishing slurry was prepared in a composition including 5% by weight of a polishing material, 0.1% by weight of 5-aminotetrazole as a corrosion inhibitor, and 1.0% by weight of hydrogen peroxide as an oxidizing agent. During the preparation of the slurry, the slurry was adjusted to a desired pH value using nitric acid and potassium hydroxide as necessary.

TABLE 1

| Experiment Example | pH | Colloidal silica | Content of polishing material (wt %) | Amount of silane coating (%) | PETEOS RR (Å/min) | SiN RR (Å/min) | PETEOS RR/SiN RR |
|---|---|---|---|---|---|---|---|
| Example 1-1 | 3.40 | 35 nm | 5 | 0.25 | 1422 | 241 | 5.90 |
| Example 1-2 | 3.40 | 55 nm | 5 | 0.25 | 1359 | 247 | 5.50 |
| Example 1-3 | 3.40 | 75 nm | 5 | 0.25 | 1261 | 251 | 5.02 |
| Comparative Example 1-1 | 3.40 | 35 nm | 5 | None | 132 | 465 | 0.28 |
| Comparative Example 1-2 | 3.40 | 55 nm | 5 | None | 105 | 484 | 0.22 |
| Comparative Example 1-3 | 3.40 | 75 nm | 5 | None | 84 | 479 | 0.18 |

According to Table 1, as the colloidal silica particles are smaller, the polishing rate for PETEOS increases, and there was an effect that the polishing rate for a PETEOS thin film rapidly increases when a silane-coated polishing material is used. There was an effect of decreasing the polishing rate for a silicon nitride film.

Experiment Example 2

An evaluation of polishing was carried out by changing the pH value of the compositions of Example 1-2. The results are presented in the following Table 2.

TABLE 2

| Experiment Example | pH | Colloidal silica | Content of polishing material (wt %) | PETEOS RR (Å/min) | SiN RR (Å/min) | PETEOS RR/SiN RR |
|---|---|---|---|---|---|---|
| Example 2-1 | 3.00 | 55 nm, silane-treated | 5 | 1222 | 240 | 5.09 |
| Example 2-2 | 3.40 | 55 nm, silane-treated | 5 | 1359 | 247 | 5.50 |
| Example 2-2 | 3.90 | 55 nm, silane-treated | 5 | 1294 | 300 | 4.31 |

TABLE 2-continued

| Experiment Example | pH | Colloidal silica | Content of polishing material (wt %) | PETEOS RR (Å/min) | SiN RR (Å/min) | PETEOS RR/SiN RR |
|---|---|---|---|---|---|---|
| Comparative Example 2-1 | 2.00 | 55 nm, silane-treated | 5 | 221 | 408 | 0.54 |
| Comparative Example 2-2 | 5.00 | 55 nm, silane-treated | 5 | — | — | — |

As can be seen from Table 2, the polishing rate for PETEOS reached the maximum at pH 3.4, and the polishing rate for a silicon nitride film tended to increase as the pH increased. At pH 5, aggregation of the polishing material occurred.

Experiment Example 3

Polishing slurry compositions were prepared in the compositions indicated in the following Table 3. Furthermore, an evaluation of polishing was carried out for the prepared polishing slurry compositions. The results are presented in the following Table 2.

The polishing slurry compositions shown in the following Table 3 each contains 5% by weight of a polishing agent produced by uniformly surface treating a colloidal silica having an average particle size of 55 nm, with γ-aminopropyltriethoxysilane in an amount of 0.25% by weight relative to the total amount of the polishing agent, 0.1% by weight of 5-aminotetrazole as a corrosion inhibitor, 1.0% by weight of hydrogen peroxide as an oxidizing agent, and 0.05% by weight of each of the additives.

TABLE 3

| Slurry | Type of additive | Ta RR (Å/min) | PETEOS RR (Å/min) | SiN RR (Å/min) | PETEOS RR/SiN RR |
|---|---|---|---|---|---|
| Control 3-1 | None | 1084 | 1359 | 247 | 5.50 |
| Example 3-1 | Arginine | 1154 | 1458 | 160 | 9.11 |
| Example 3-2 | L-aspartic acid | 1062 | 1498 | 153 | 9.79 |
| Example 3-3 | glutamic acid | 1133 | 1519 | 186 | 8.17 |
| Example 3-4 | Alanine | 1239 | 1540 | 103 | 14.95 |
| Comparative Example 3-1 | Oxalic acid | 1028 | 254 | 333 | 0.76 |
| Comparative Example 3-2 | Citric acid | 1046 | 305 | 354 | 0.86 |
| Comparative Example 3-3 | Tartaric Acid | 1010 | 513 | 345 | 1.49 |

As can be seen from Table 3, when the additives according to the present invention is added, the polishing rate for PETEOS increased, the polishing rate for a silicon nitride film decreased, and the polishing rate for tantalum was maintained. However, the additives of the Comparative Examples lowered the polishing rate for a silicon oxide film, and increased the polishing rate for a nitride film.

Experiment Example 4

Polishing slurry compositions were prepared by further adding a profile improving agent to the composition of Example 3-4, and then an evaluation of polishing of a 300-mm wafer was carried out. The results are presented in the following Table 4 and FIG. 2.

Poli 762 (G&P Technology, Inc.) was used as the polishing apparatus, and a polishing test was carried out using a polishing pad, IC1070 (Dow Corning Corp.). The polishing conditions were such that the table/head speed was 67/53 rpm, the polishing pressure was 1.5 psi, the slurry supply flow rate was 250 ml/min, and the polishing time was 60 seconds.

In regard to the wafer used in polishing, a 300-mm wafer on which a PETEOS thin film having a thickness of 20000 Å was deposited was used, and the polishing rate was measured with 51 point lines to observe any changes in the profile of the wafer.

TABLE 4

| Experiment Example | Type of profile improving agent | Content of profile improving agent (wt %) | Profile | PETEOS RR (Å/min) | NU (%) |
|---|---|---|---|---|---|
| Example 4-1 | Ethylene glycol | 0.5 | Edge slow | 747 | 6.44 |
| Example 4-2 | Ethylene glycol | 1.0 | Edge slow | 678 | 5.66 |
| Example 4-3 | Ethylene glycol | 3.0 | Edge slow | 704 | 4.98 |
| Example 4-4 | Polyethylene glycol | 1.0 | Edge slow | 692 | 8.45 |
| Comparative Example 4-1 | None | — | Edge fast | 756 | 13.94 |

Figure 2:
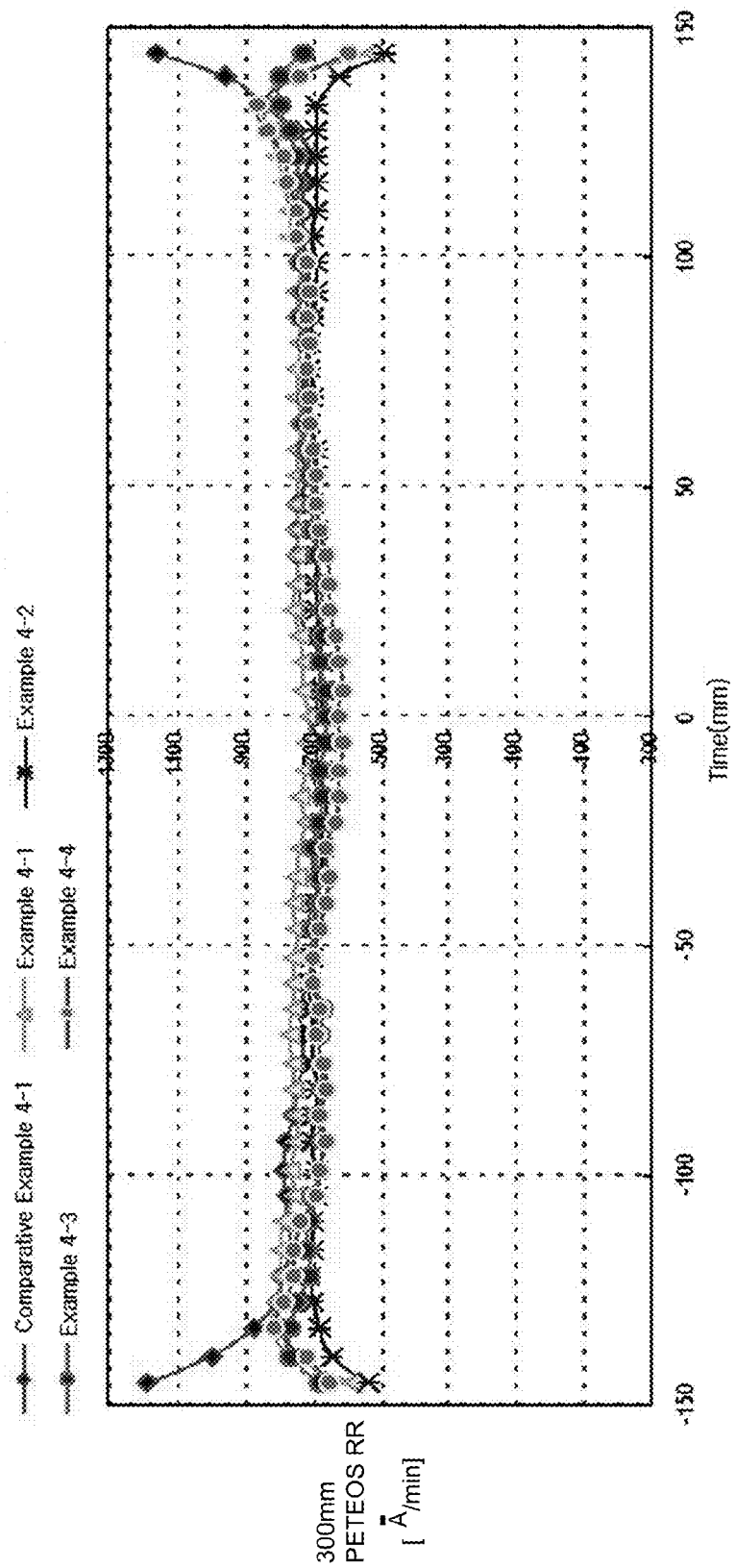
FIG. 2 is a diagram showing the results obtained by monitoring the changes in the polishing profile of the slurry composition for chemical mechanical polishing prepared in Experiment Example 4 according to the present invention.

According to Table 4 and FIG. 2, when a compound containing a glycol group is further added to a polishing slurry composition containing an aminosilane-surface treated polishing agent and an additive such as an amino acid, the polishing profile characteristics improve. Also, it can be seen that as the content of the profile improving agent increases, the polishing profile characteristics improve, and uniform polished surface can be obtained.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

What is claimed is:

1. A slurry composition for chemical mechanical polishing, comprising:
   0.1% to 20% by weight of an aminosilane-surface treated polishing agent;
   0.001% to 5% by weight of any one additive selected from the group consisting of amino acids, amino acid derivatives, salts thereof, and combinations thereof;
   0.0001% to 0.5% by weight of a corrosion inhibitor; and
   0.01% to 5% by weight of an oxidizing agent;
   with the balance being a solvent
   wherein the slurry composition for chemical mechanical polishing has a pH value of 3 to 3.9, a polishing selection ratio for silicon oxide film to silicon nitride film of 7 to 50, and a polishing rate for PETEOS of 1458 Å/min or greater.

2. The slurry composition for chemical mechanical polishing according to claim 1, wherein the aminosilane is any one selected from the group consisting of aminopropyltrialkoxysilane, γ-aminopropyltriethoxysilane, bis(2-hydroxyethyl)-3-aminopropyltrialkoxysilane, diethylaminomethyltrialkoxysilane, (N,N-diethyl-3-aminopropyl)trialkoxysilane, 3-(N-styrylmethyl-2-aminoethylamino)-propyltrialkoxysilane, (2-N-benzylaminoethyl)-3-aminopropyltrialkoxysilane, trialkoxysilylpropyl-N,N,N-trimethylammonium chloride, N-(trialkoxysilylethyl)benzyl-N,N,N-trimethylammonium chloride, bis(methyldialkoxysilylpropyl)-N-methylamine, bis(trialkoxysilylpropyl)urea, bis(3-(trialkoxysilyl)propyl)-ethylenediamine, bis(trialkoxysilylpropyl)amine, bis(trimethoxysilylpropyl)amine, and combinations thereof.

3. The slurry composition for chemical mechanical polishing according to claim 1, wherein the amino acid is any one selected from the group consisting of valine, leucine, isoleucine, serine, threonine, cysteine, glycine, alanine, methionine, glutamic acid, aspartic acid, glutamine, asparagine, lysine, arginine, phenylalanine, tyrosine, tryptophan, histidine, proline, derivatives thereof, salts thereof, and combinations thereof.

4. The slurry composition for chemical mechanical polishing according to claim 1, wherein the corrosion inhibitor is any one selected from the group consisting of 1,2,4-triazole, benzotriazole, 5-methylbenzotriazole, 5-aminotetrazole, 1-alkyl-5-aminotetrazole, 5-hydroxytetrazole, 1-alkyl-5-hydroxytetrazole, tetrazole-5-thiol, imidazole, and combinations thereof.

5. The slurry composition for chemical mechanical polishing according to claim 1, wherein the oxidizing agent is any one selected from the group consisting of hydrogen peroxide, persulfates, and combinations thereof.

6. The slurry composition for chemical mechanical polishing according to claim 1, wherein the aminosilane-surface treated polishing agent is a colloidal silica having an average particle size of 5 to 120 nm, and contains an aminosilane in an amount of 0.001% to 1% by weight relative to the total amount of the polishing agent.

7. The slurry composition for chemical mechanical polishing according to claim 1, further comprising any one pH adjusting agent selected from the group consisting of potassium hydroxide, ammonium hydroxide, tetramethylammonium hydroxide, tetraethylammonium hydroxide, tetrabutylammonium hydroxide, nitric acid, hydrochloric acid, sulfuric acid, perchloric acid, phosphoric acid, and combinations thereof.

8. The slurry composition for chemical mechanical polishing according to claim 1, further comprising a polishing profile improving agent containing a glycol group in an amount of 0.001% to 5% by weight relative to the total amount of the slurry composition for chemical mechanical polishing.

9. The slurry composition for chemical mechanical polishing according to claim 8, wherein the polishing profile improving agent is any one selected from the group consisting of ethylene glycol, propylene glycol, polyethylene glycol, polypropylene glycol, and combinations thereof.

10. A method for producing a semiconductor device, the method comprising simultaneously polishing a barrier metal film, a silicon oxide film and a silicon nitride film using the slurry composition for chemical mechanical polishing according to any one of claim 1 and claims 2 to 9.

11. The method for producing a semiconductor device according to claim 10, wherein through silicon vias are formed by the simultaneously polishing.

* * * * *